(12) United States Patent
Kuzmenka

(10) Patent No.: US 6,996,685 B2
(45) Date of Patent: Feb. 7, 2006

(54) DEVICE FOR ACCESSING REGISTERED CIRCUIT UNITS

(75) Inventor: Maksim Kuzmenka, München (DE)

(73) Assignee: Infineon Technologies AG, Munich (DE)

( * ) Notice: Subject to any disclaimer, the term of this patent is extended or adjusted under 35 U.S.C. 154(b) by 420 days.

(21) Appl. No.: 10/284,774

(22) Filed: Oct. 31, 2002

(65) Prior Publication Data

US 2003/0084267 A1    May 1, 2003

(30) Foreign Application Priority Data

Oct. 31, 2001   (DE) ................................ 101 53 752

(51) Int. Cl.
*G06F 12/00* (2006.01)
*G11C 8/06* (2006.01)

(52) U.S. Cl. .................. 711/154; 711/105; 365/51; 365/52; 365/149; 365/230.08

(58) Field of Classification Search ................ 365/51, 365/52, 149, 230.08; 711/105, 154
See application file for complete search history.

(56) References Cited

U.S. PATENT DOCUMENTS 5,835,931 A   11/1998  Brandt et al.
6,298,413 B1  10/2001  Christenson
2002/0075717 A1 * 6/2002 Raad ........................... 365/51

FOREIGN PATENT DOCUMENTS

DE   198 38 813 A1   3/2000
EP     0 782 076 A1   7/1997

* cited by examiner

*Primary Examiner*—Jack Lane
(74) *Attorney, Agent, or Firm*—Laurence A. Greenberg; Werner H. Stemer; Ralph E. Locher

(57) ABSTRACT

A device is provided for accessing circuit units via access registers. The circuit units have a plurality of inputs for access to said circuit units. A first access register having register outputs which are connected to a first part of the inputs of at least one first circuit unit, and having register outputs which are connected to inputs of at least one second circuit unit is provided. In addition, a second access register having register outputs which are connected to a second part of the inputs of said at least one first circuit unit, and having register outputs connected to inputs of at least one third circuit unit is provided. Moreover, an access register is provided which has a number of register inputs, first register outputs for driving the inputs of at least one first circuit unit, each register input having associated therewith a first register output, and second register outputs for driving part of the inputs of at least one second circuit unit, a subset of the register inputs having associated therewith a second register output.

11 Claims, 4 Drawing Sheets

DEVICE FOR ACCESSING REGISTERED CIRCUIT UNITS

BACKGROUND OF THE INVENTION

1. Field of the Invention

The present invention relates to a device for accessing at least one registered circuit unit via an access register, and, in addition, it relates to an access register which is adapted to be used for such access.

2. Description of Prior Art

One example of a scenario where access to circuit units takes place via access registers are memory modules comprising registered memory chips, e.g. DRAM memory modules (DRAM=dynamic random access memory). In the case of such memory modules, e.g. 9, 18 or 36, memory chips are arranged on the board of the memory module, control access to the memory chips being effected making use of memory registers. Inputs of the memory registers are connected to an input C/A bus (C/A=command/address) so as to receive command/address signals from a memory control. The outputs of the registers are, again via respective C/A buses, connected to the respective memory chips. The C/A buses have a predetermined number of positions, i.e. lines, the respective ports of memory registers and memory chips, which are connected to respective buses, comprising a corresponding number of inputs and outputs, respectively.

In known command/address bus architectures in a registered DDR-DIMM (DDR-DIMM=double data rate dual inline memory module) the data rate is limited due to the high input capacitance of the DRAM chips and the long connecting buses leading from the registers to many DRAM chips. In the case of existing topologies, the track length of the connecting buses between memory registers and memory chips is very long and not symmetric.

Examples of existing command/address bus architectures are shown in FIGS. 3 and 4.

FIG. 3 shows nine memory units 1 to 9 formed e.g. by nine memory chips which are arranged on the board of a memory module. In the architecture shown, the nine memory chips are arranged side by side in groups of five memory chips and four memory chips, memory registers 10 and 12 being arranged between the groups. The respective second contours, which are shown in FIG. 3 and one of which is, by way of example, designated by 1', are shown for indicating that a corresponding arrangement of nine memory chips may be provided on a second surface of a memory module board so that the memory module comprises a total of eighteen memory chips. The two access registers 10 and 12 each have a number of register inputs connected to lines of a register input bus 14. The register input bus is a C/A bus. For the sake of clarity, FIG. 3 shows only four lines for each register input bus 14. In reality, each register input bus 14 comprises a higher number of lines, i.e. positions, e.g. twenty-four positions.

The access registers 10 and 12 have, as is usually the case, buffer elements and drivers for driving outputs of the access registers. The outputs of the buffer registers 10 and 12 are connected to respective connecting buses 16 and 18 having the same number of lines as the register input buses 14 and representing C/A buses as well. The access registers 10 and 12 can therefore be referred to as 1/1 access registers.

The connecting bus 16 serves to connect the outputs of the access register 10 to respective inputs of the group of five memory chips 1, 2, 3, 4 and 5. The number of inputs of the respective memory chips corresponds to the number of lines of the connecting bus 16. Again for the sake of clarity, only four positions are shown with regard to the bus 16 as well as with regard to the inputs of the memory chips, although, in reality, a larger number of positions, e.g. twenty-four, is provided. The four inputs of the circuit chip 1 are, by way of example, designated by reference numeral 20. As can be seen in FIG. 3, the connecting bus 16 comprises respective branch points, one of which is, by way of example, designated by reference numeral 22, so as to connect each of the bus lines to the associated input of each of the circuit chips 1 to 5.

The connecting bus 18 has the same configuration so as to connect the outputs of the access register 12 to associated inputs of each of the memory chips 6, 7, 8 and 9. The four inputs of the memory chip 9 are, again by way of example, designated by reference numeral 24, whereas examples of branch points, which permit a bus line 28 to connect the respective output of the access register 12 to the associated inputs of the memory chips 6, 7, 8 and 9, are designated by reference numeral 26.

As can be seen in FIG. 3, five memory chips are arranged on one side of the access registers 10, 12, whereas only four memory chips are arranged on the other side thereof. In order to compensate different bus lengths resulting from this dissymmetry, a compensation point 30 is provided in the connecting bus 18 so as to compensate the otherwise shorter line lengths of the connecting bus 18 resulting from the smaller number of memory chips with which this connecting bus establishes a connection. It follows that, in the architecture shown in FIG. 3, it is necessary to insert an additional bus length for compensation so as to produce identical electrical lengths of the connecting buses 16 and 18; in spite of this insertion of an additional bus length, a symmetry of the topology cannot be obtained.

FIG. 4 shows a further known architecture of registered memory chips; in said FIG. 4 reference numerals which are comparable to those used in FIG. 3 have been used for comparable elements. In contrast to FIG. 3, the architecture of FIG. 4 uses only one access register 32 comprising again a predetermined number of inputs, e.g. twenty-four, which are connected to a register input bus 14; for the sake of clarity, also FIG. 4 shows only four positions of the input bus and four inputs of the access register 32. The outputs of this individual access register are connected to two connecting buses 16 and 18 establishing a connection to the respective left and right groups of memory chips. Each connecting bus 16 and 18 comprises a number of positions corresponding to that of the input bus 14. Hence, the access register 32 can be referred to as 1/2 access register, since it provides a division of an input bus 14 comprising a predetermined number of positions into two output buses 16, 18 comprising each the same predetermined number of positions.

In the case of the example shown in FIG. 4, the problem of different track lengths of the connecting buses 16 and 18 has to be solved in the same way as in the case of the example shown in FIG. 3, so that a compensation point 30, which provides an additional track length, is again provided in the connecting bus 18. However, a symmetric topology cannot be achieved in this case either.

In addition to the above-described asymmetric topologies, the architectures described with reference to FIGS. 3 and 4 have long track lengths of the connecting buses 16 and 18. This increases, on the one hand, the access time to the memory chips, which are controlled via the connecting buses 16 and 18, and, on the other hand, it reduces the signal quality of the signals transmitted via the connecting buses.

SUMMARY OF THE INVENTION

It is the object of the present invention to provide a device for accessing registered circuit units and an access register which is adapted to be used for such accessing, the accessing device and the access register allowing a reduced access time and an improved access signal quality.

According to a first aspect of the invention this object is achieved by a device for accessing circuit units via access registers, the circuit unit comprising a plurality of inputs for access to said circuit units, said device comprising:

a first access register having register outputs which are connected to a first part of the inputs of at least one first circuit unit, and having register outputs which are connected to inputs of at least one second circuit unit; and a second access register having register outputs which are connected to a second part of the inputs of said at least one first circuit unit, and having register outputs which are connected to inputs of at least one third circuit unit.

According to a second aspect, the above object is achieved by an access register comprising:

a number of register inputs;

first register outputs for driving the inputs of at least one first circuit unit, each register input having associated therewith a first register output; and second register outputs for driving part of the inputs of at least one second circuit unit, a subset of the register inputs having associated therewith a second register output.

The present invention is based on the fundamental idea that a symmetric topology of access registers and circuit units, which are to be accessed via these access registers, can be realized when part of the circuit units are accessed not only via only one register but via at least two registers. These circuit units, which are accessed via two registers, are spatially associated with these two registers preferably in such a way that line lengths of the buses connecting inputs of the circuit units to outputs of a first access register are essentially identical with line lengths of the buses connecting inputs of the circuit units to outputs of a second access register. In order to achieve this, the circuit units can preferably be arranged between the access registers. Circuit units having inputs which are all connected to one access register can then be arranged on the outer sides of each of the two above-mentioned access registers. A symmetric configuration with reduced line lengths of the connecting buses will be obtained in this way.

In order to obtain the above-mentioned topology, an access register according to the present invention has first register outputs for driving all the inputs of a fist number of circuit units. Furthermore, the access register has second register outputs for driving part of the inputs of a second number of circuit units. In addition, the access register comprises a number of register inputs. The number of register inputs corresponds preferably to the number of first register outputs. When the second circuit units are controlled by two access registers, the number of second register outputs of the access register preferably corresponds to half the number of register inputs. It follows that such an access register according to the present invention can be referred to as 1/1.5 register, since the number of outputs of this register is equal to 1.5 times the number of inputs of said register.

The device according to the present invention can be used in an advantageous manner for providing access to a large number of circuit units, the circuit units being arranged preferably substantially symmetrical with respect to the access registers. The present invention can especially be used in an advantageous manner, when an uneven number of circuit units is to be accessed via registers on one level of a circuit board. In addition, the present invention can be used advantageously, when an uneven number of circuit registers is to be accessed on each of a plurality of levels; in this case, the same access registers can be used for the different levels. The term different levels can e.g. describe the arrangement of circuit units on various layers of a multi-layer board, or the arrangement of such circuit units on the back or on the front of a board or of a multi-layer board.

The present invention is particularly suitable for use in connection with memory modules and provides a new kind of C/A bus topology (command/address bus topology). Such a topology preferably uses a symmetric arrangement of the memory units, e.g. of the DRAM chips, with respect to two memory registers. When nine memory units are used, e.g. three memory units can be arranged on one side of an access register, three memory units can be arranged between the access registers and three on the side of the other access register which is still free. The two access registers have an asymmetrically divided output bus of such a nature that a first connecting bus comprising a first number of positions provides a connection to the outer circuit units, whereas a second connecting bus comprising a smaller number of positions provides a connection to the circuit units located between the access registers. This topology can be used in the same way, when e.g. 18 or 36 memory units, which can be memory chips, are arranged on several levels of the memory module, which are to be accessed by two access registers.

According to the present invention, each output driver drives preferably the same number of circuit unit inputs. According to the preferred embodiment of the present invention, each register output driver drives e.g. three inputs in the case of a memory module with nine memory units or DRAM units, or six inputs in the case of a memory module with 18 memory units. The overall delay of the post-register networks, i.e. the connecting buses between access registers and circuit units which are accessed, becomes approximately three times smaller the overall delay of existing topologies. In addition, the topology can be designed such that it is absolutely electrically symmetrical, so that length compensation becomes easy. Since compensation points, e.g. in the form of meander-shaped structures, are no longer necessary, less board area will be required for the C/A bus, and this may offer the possibility of dispensing with one or a plurality of layers of the printed multi-layer board. In view of the symmetry, the reduced number of inputs to be driven and the reduced line lengths, it is possible to use access registers with lower drive power, and this has the effect that less SSO effects (SSO=simultaneous switching occurrence) will occur.

The term SSO effects stands for the influence which one driver has on another driver in the case of simultaneous switching in a register chip. This effect depends on the load capacitance of the register; according to the present invention, SSO effects are small due to the small number of loads and the short track lengths and therefore capacitances. Another advantage of the topology according to the present invention is to be seen in the fact that a reduced ISI (intersymbol interference) will occur. Asymmetric topologies are impaired by resonances in the case of certain combinations of zeros and ones, when the maximum of the frequency spectrum of the signal coincides with the maximum (extreme value) of the frequency characteristics of a given network or a given bus topology. Symmetric topologies are essentially free of this effect.

BRIEF DESCRIPTION OF THE DRAWINGS

In the following, preferred embodiments of the present invention will be explained in detail making reference to the drawings, in which.

DESCRIPTION OF PREFERRED EMBODIMENTS OF THE INVENTION

In the following the present invention will be explained in detail making reference to a C/A bus topology of a memory module; to those skilled in the art, it will, however, be obvious that the present invention can be used for accessing arbitrary registered circuit units.

Figure 1:
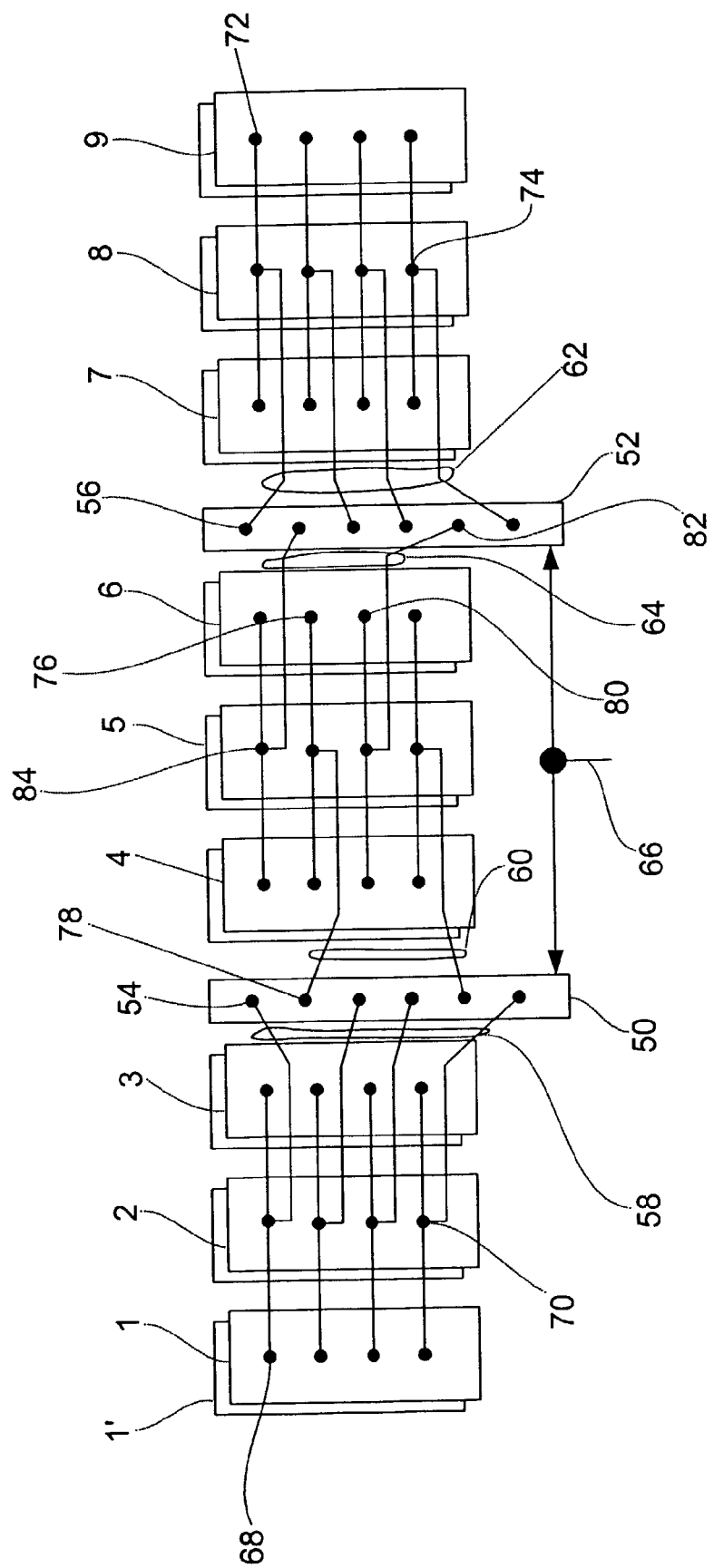
FIG. 1 shows a schematic representation of a preferred embodiment of a device according to the present invention.

Making reference to FIG. 1, a preferred embodiment of the present invention, which provides a new kind of topology of a command/address bus for memory modules, will be explained in detail in the following. In FIG. 1, a plurality of nine DRAM memory units 1 to 9 is shown. In the preferred embodiment, the memory units are memory chips mounted on the board of a memory module. Furthermore, the displaced contour lines in FIG. 1, one of which is designated by reference numeral 1', indicate that 18 or 36 memory units can be accessed in an analogous way, said 18 or 16 memory units being arranged in groups of nine memory units on different levels of a memory module.

As can be seen in FIG. 1, the nine memory units 1 to 9 are arranged symmetrically with respect to two memory registers 50 and 52. This is accomplished by subdividing the nine memory units 1 to 9 into three groups, three memory units 1, 2 and 3 being arranged on the left-hand side of the first memory register 50, three memory units 4, 5, 6 being arranged between the two memory registers 50 and 52, and three memory units 7, 8, 9 being arranged on the right-hand side of second memory register 52. The two memory registers 50 and 52 are each provided with outputs, one output of the memory register 50 being, by way of example, designated by reference numeral 54 in FIG. 1, whereas one output of the memory register 52 is, by way of example, designated by reference numeral 56 in FIG. 1. The outputs of the memory register 50 are asymmetrically connected to two connecting buses 58 and 60. For reasons of representability and clarity, four positions are shown for the connecting bus 58, whereas two positions are shown for the connecting bus 60. In reality, each of the connecting buses would actually comprise a larger number of positions; the connecting bus 58, for example, would comprise a number of twenty-four positions, whereas the connecting bus 60 would comprise a number of two positions, i.e. lines.

In a similar way, the outputs of the memory register 52 are asymmetrically connected to two connecting buses 62 and 64; also in this case, only four positions are shown for the connecting bus 62 and only two positions are shown for the connecting bus 64, whereas, in reality, these buses comprise e.g. twenty-four and twelve positions, respectively.

The connecting buses 58, 60, 62 and 64 represent C/A buses via which command and address signals, i.e. control signals, are transmitted to the respective inputs, i.e. control inputs, of memory units.

An input C/A bus into the access registers 50 and 52 is designated by reference numeral 66 in FIG. 1. This input bus comprises, in reality, e.g. twenty-four positions, i.e. lines, which are connected to twenty-four corresponding inputs of the respective memory register. For explanatory reasons, it will assumed in the following that the register input bus 66 comprises twenty-four positions, the connecting buses 58 and 62 comprise twenty-four positions as well, and the connecting buses 60 and 64 comprise twelve positions each.

Each of the twenty-four lines of the connecting bus 58 connects a respective output 54 of the access register 50 to a respective associated input of each of the memory chips 1, 2 and 3; in FIG. 1, such an input is, by way of example, designated by reference numeral 68. For this purpose, respective bus branches are provided, one of these bus branches being, by way of example, designated by reference numeral 70 in FIG. 1. It follows that each line of the connecting bus 58 connects the associated output 54 of the access register 50 to the respective associated input of three memory chips 1, 2 and 3.

Likewise, each line of the connecting bus 62 connects an associated output 56 of the access register 52 to the respective associated input of the three memory chips 7, 8 and 9, one input of the memory chip 9 being, by way of example, designated by reference numeral 72. In order to obtain this connection, respective bus branches are again provided, one of these bus branches being designated by reference numeral 74.

Furthermore, each line of the connecting bus 60 connects an associated output of the access register 50, one of these outputs being, by way of example, designated by reference numeral 78, to one respective input of the three memory chips 4, 5 and 6, one input of the memory chip 6 being, by way of example, designated by reference numeral 76. It follows that the lines of the connecting bus 60 connect twelve outputs 78 of the access register 50 to twelve of the twenty-four inputs of the respective memory chips 4, 5 and 6. The other twelve inputs of the memory chips 4, 5 and 6, one such input of the memory chip 6 being, by way of example, designated by reference numeral 80, being connected via the connecting bus 64 to twelve outputs of the access register 52, such an output being, by way of example, designated by reference numeral 82. Suitable branches permitting the respective connection between an output 78 and 82, respectively, and three inputs 76 and 80, respectively, are provided; one such a branch is, by way of example, designated by reference numeral 84.

It should here be pointed out that in the representation of FIG. 1 the inputs of the memory chips 2, 5 and 8 coincide with respective branches and are therefore not shown as separate spots.

In the above-described configuration, the outputs of the access registers 50 and 52 are therefore asymmetrically distributed to two connecting buses, i.e. C/A buses. The connecting bus 58 comprises a number of positions, i.e. lines, permitting a connection to all the inputs of a number of memory units, i.e. the memory units 1, 2 and 3. The same applies to the connecting bus 62 which provides a connection to all the inputs of a number of memory units, viz. the units 7, 8 and 9. In contrast to this, the connecting bus 60 only provides a connection to half of the number of inputs of the memory chips 4, 5 and 6, whereas the connecting bus 64 provides a connection to the other half of the number of inputs of these memory units. It follows that the memory units 4, 5 and 6 are accessed and controlled, respectively, via both access registers 50 and 52.

Starting from an input bus with twenty-four positions, the access registers 50 and 52 therefore provide a first output bus with twenty-four positions and a second output bus with twelve positions. Of the twenty-four positions of the access signals, i.e. command and address signals, delivered on the input bus 66, twelve positions are delivered to the memory units 4, 5 and 6 by the access register 50 and twelve positions by the access register 52. The n-position access signal is therefore adequately provided for the memory units 4, 5 and 6, said access signal being so to speak "subdivided" in the access registers 50 and 52 and then re-combined by correctly connecting the connecting buses 60 and 64.

Figure 2:
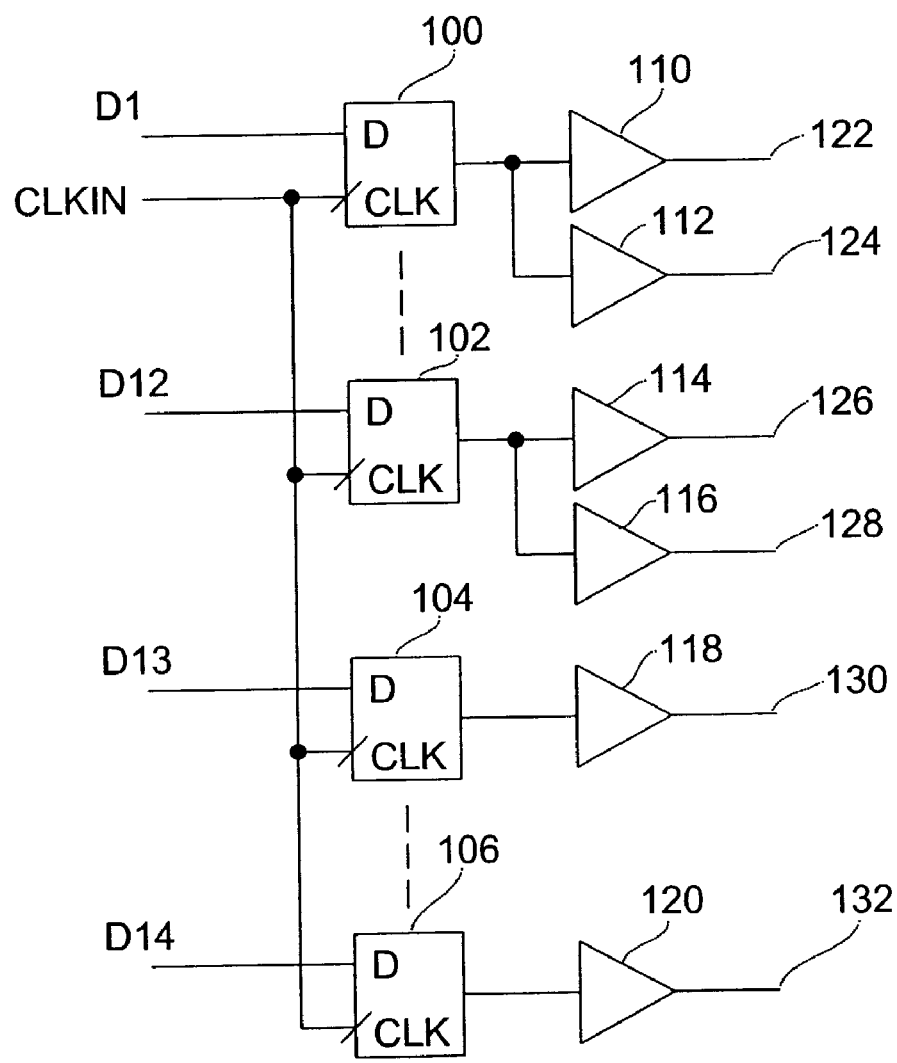
FIG. 2 shows a schematic representation of a preferred embodiment of an access register according to the present invention.
Figure 3:
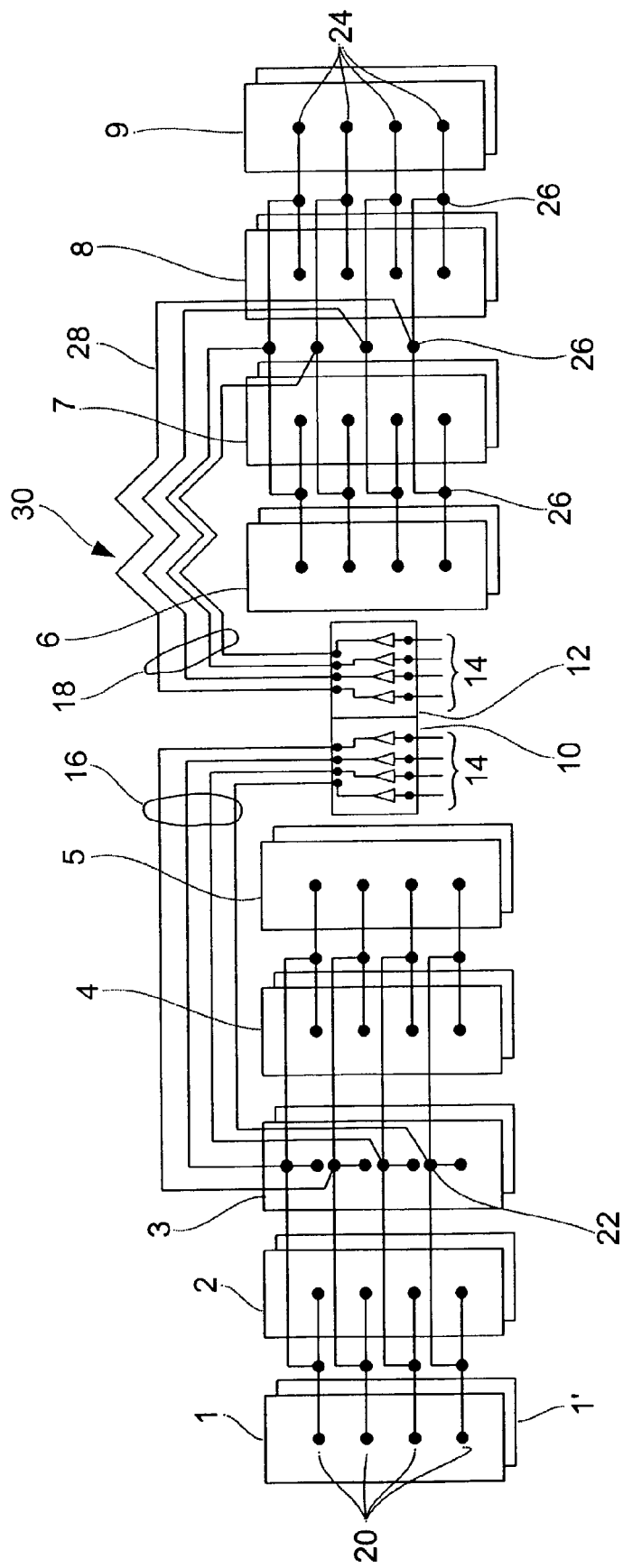
FIGS. 3 and 4 show known C/A bus topologies.
Figure 4:
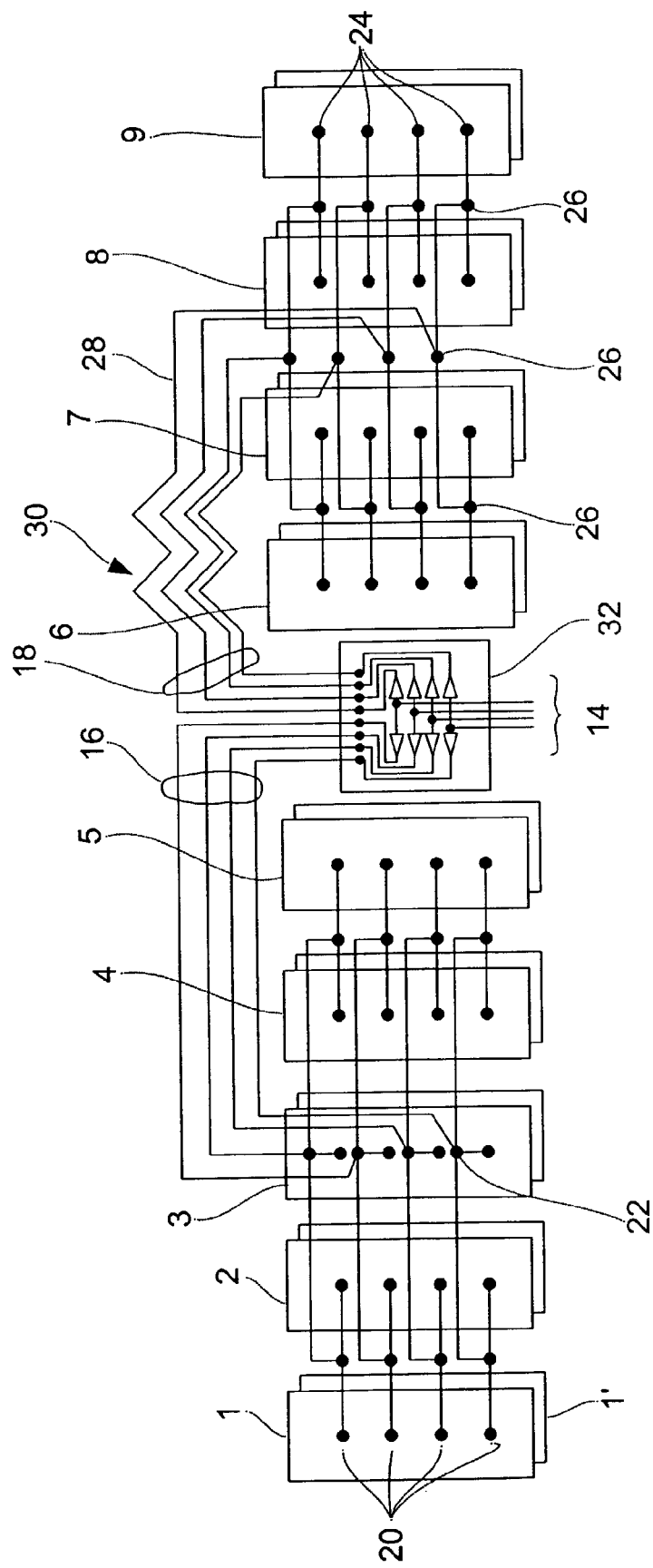

A preferred configuration of an access register providing a functionality of the above-mentioned type is shown e.g. in FIG. 2. The access register has twenty-four inputs D1 to D24; for the sake of clarity, only four, D1, D12, D13 and D24 of these inputs are shown in FIG. 2. Furthermore, the access register has a clock input CLKIN. The clock signal received via the clock input CLKIN as well as the signals received at the respective inputs D1 to D24 are, as is normally the case in memory registers, supplied to a respective buffer means 100, 102, 104 and 106. In the embodiment shown, the buffer means 100, 102, 104 and 106 are clock-pulse controlled flip-flops. As can be seen in said FIG. 2, the inputs D1 to D24 are connected to the respective D-input of the flip-flops, whereas the clock input CLKIN is connected to the respective clock input CLK of the flip-flops 100, 102, 104 and 106.

The outputs of the buffer means 100, 102, 104 and 106 are connected to drivers 110, 112, 114, 116, 118 and 120 having, in principle, a conventional structural design. As can be seen in FIG. 2, the inputs D1 and D12 each have associated therewith a divided output, input D1 having associated therewith the outputs 122 and 124, whereas input D12 has associated therewith the outputs 126 and 128. As can be seen from the broken line between the inputs D1 and D12, all the inputs D1 to D12 are provided with such an associated divided output, whereas the inputs D13 and D24 are each provided with only one associated output 130 and 132; as indicated by the broken line, this applies in the same way to all the inputs D13 to D24.

Twenty-four outputs, each of which is coupled to an input, or, in other words, each of which is associated with an input D1 to D24—four outputs 122, 126, 130 and 132 of these twenty-four outputs being shown in FIG. 2—are connected to a 24-position C/A bus, e.g. the connecting bus 58, whereas the respective second output of the divided outputs, in FIG. 2 the outputs 124 and 128, are connected to a 12-position C/A bus, e.g. the connecting bus 60. The access register shown in FIG. 2 provides in this way the functionality that has been described hereinbefore making reference to FIG. 1.

When the access register shown in FIG. 2 is used as access register 50 in FIG. 1, it will supply the input signals provided at the first twelve inputs, i.e. the first twelve positions, to the memory units 4, 5 and 6. The access register 52 would therefore have a "complementary" configuration insofar as a divided output would be associated with each of the inputs D13 to D24. It follows that the last twelve positions of the input signal would be supplied to the memory units 4, 5 and 6 via the access register 52.

Although, in the above embodiments, the first twelve inputs each have associated therewith a divided output, it is clearly evident that the divided outputs can be distributed among the inputs in an arbitrary manner as long as the necessary number of divided outputs is obtained; in the embodiment described, in which memory units are accessed by two access registers, preferably half the number of inputs has associated therewith a divided output. In view of the fact that the register shown in FIG. 2 comprises, with the exception of the clock input, twenty-four inputs and thirty-six outputs, this register can be referred to as a 1/1.5 register.

To those skilled in the art it will be clearly evident that only preferred embodiments of the present invention have been explained hereinbefore with reference to FIGS. 1 and 2. In particular with respect to the number of positions, number of memory units as well as number of access registers, the present invention permits arbitrary variations. Especially, the inputs of memory units or circuit units in general can also be connected to more than two access registers. Furthermore, arrangements are imaginable in which the circuit units are arranged in a two-dimensional array instead of being arranged in a one-dimensional row, as in the case of the embodiment described with reference to FIG. 1.

What is claimed is:

1. A device for accessing circuit units via access registers, the circuit units comprising a plurality of inputs for access to said circuit units, said device comprising:
   a first access register having register outputs which are connected to a first part of the inputs of at least one first circuit unit, and having register outputs which are connected to inputs of at least one second circuit unit; and
   a second access register having register outputs which are connected to a second part of the inputs of said at least one first circuit unit, and having register outputs connected to inputs of at least one third circuit unit.

2. The device according to claim 1, wherein the first access register, the second access register or both have register inputs, the register outputs connected to the at least one first circuit unit being lower in number than the register inputs.

3. The device according to claim 2, wherein each register output has associated therewith a register input.

4. The device according to claim 1, wherein said at least one first circuit unit, whose inputs have connected thereto outputs of said first and second access registers, is arranged spatially between said first and second access registers.

5. The device according to claim 1, wherein the access registers have n register inputs and wherein the number of the first and second parts of the inputs of the at least one first circuit unit is n/2 respectively.

6. The device according to claim 1, wherein the circuit units are memory chips and wherein the access registers are memory registers.

7. The device according to the claims 1 for accessing a plurality of circuit units, wherein the circuit units are arranged substantially symmetrically with respect to the access registers.

8. The device according to claim 7, wherein the circuit units are arranged relative to the access registers in such a way that the second and third circuit units are spatially associated with a respective access register, and said at least one first circuit unit is spatially associated with two access registers, the inputs of the at least one first circuit unit being connected to register outputs of the two spatially associated access registers.

9. The device according to claim 8, wherein the at least one first circuit unit is arranged between the spatially associated access registers.

10. The device according to claim 1 for driving a plurality of circuit units, wherein each register output is connected to the same number of inputs of circuit units.

11. An access register comprising:

a number of register inputs;

first register outputs for driving the inputs of at least one first circuit unit, each register input having associated therewith a first register output; and second register outputs for driving part of the inputs of at least one second circuit unit, and only a subset of the register inputs having associated therewith a second register output.

* * * * *